(12) United States Patent
Tourret

(10) Patent No.: US 9,331,678 B2
(45) Date of Patent: May 3, 2016

(54) LOCAL OSCILLATOR SIGNAL GENERATION

(71) Applicant: NXP B.V., Eindhoven (NL)

(72) Inventor: Jean-Robert Tourret, Cormelles le Royal (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/077,912

(22) Filed: Nov. 12, 2013

(65) Prior Publication Data

US 2014/0159781 A1 Jun. 12, 2014

(30) Foreign Application Priority Data

Dec. 10, 2012 (EP) .................................. 12290430

(51) Int. Cl.
*H03K 3/037* (2006.01)
*H03L 7/081* (2006.01)
*H03B 19/00* (2006.01)

(52) U.S. Cl.
CPC .............. *H03K 3/037* (2013.01); *H03B 19/00* (2013.01); *H03L 7/0812* (2013.01)

(58) Field of Classification Search
CPC ............................... H03K 3/037; H03B 19/00
USPC ............. 327/117, 276, 277; 375/259; 331/57
See application file for complete search history.

(56) References Cited

U.S. PATENT DOCUMENTS

| 5,317,202 | A | 5/1994 | Waizman |
| 5,892,797 | A | 4/1999 | Deng |
| 6,642,801 | B1 * | 11/2003 | Zortea et al. ................... 331/57 |
| 7,042,257 | B2 | 5/2006 | Wang |
| 2004/0217788 | A1 | 11/2004 | Kim |
| 2004/0223566 | A1 * | 11/2004 | Yamashita ................... 375/354 |
| 2005/0053162 | A1 | 3/2005 | Goishi |
| 2005/0057314 | A1 | 3/2005 | Hsu et al. |
| 2005/0271169 | A1 | 12/2005 | Momtaz et al. |

(Continued)

FOREIGN PATENT DOCUMENTS

| EP | 1 545 045 A2 | 6/2005 |
| EP | 1 560 360 A2 | 8/2005 |

OTHER PUBLICATIONS

Zhang, Li et al. "A Low Power 440-MHz Pulse-Swallow-Divider Combination Synchronization-Asynchronism-Hybrid Frequency Divider", 49th IEEE Intl. Midwest Symp. on Circuits and Systems, vol. 2, pp. 566-568 (Aug. 2006).

(Continued)

*Primary Examiner* — Joseph Chang
*Assistant Examiner* — Jeffrey Shin

(57) ABSTRACT

A local oscillator signal generation circuit for a frequency divider circuit is disclosed. The local oscillator signal generation circuit includes a delay device adapted to delay a data signal according to a control signal, a data flip-flop having the delayed data signal provided to its data input terminal and a reference clocking signal provided to its clock input terminal and a control circuit adapted to generate first and second partially overlapping pulse windows from the delayed data signal and to generate a control signal based on the first and second partially overlapping pulse windows and the reference clocking signal. The control signal is provided to the delay device to control the amount by which the data signal is delayed so that the data signal is stable when it is sampled by the data flip-flop. A local oscillator signal is derived from the output of the data flip-flop.

15 Claims, 11 Drawing Sheets

(56) References Cited

U.S. PATENT DOCUMENTS

2007/0268990 A1    11/2007   Warren
2008/0042697 A1     2/2008   Narathong et al.

OTHER PUBLICATIONS

Extended European Search Report for EP Patent Appln. No. 12290430.3 (Jul. 29, 2013).

* cited by examiner

LOCAL OSCILLATOR SIGNAL GENERATION

CROSS-REFERENCE TO RELATED APPLICATIONS

This application claims the priority under 35 U.S.C. §119 of European patent application no. 12290430.3, filed on Dec. 10, 2012, the contents of which are incorporated by reference herein.

FIELD OF THE INVENTION

This invention relates to the field of electronic circuits, and more particularly to the generation of a local oscillator signal by means of an electronic circuit such as a frequency divider circuit.

BACKGROUND

Radio Frequency (RF) transceivers are mainly used to shift a RF input spectrum down in frequency in order to reduce the sampling frequency of digital channel decoders.

Frequency division is a well-known concept, especially in the field of telecommunications, which may be used to reduce the frequency of a signal.

Such frequency division is typically used in the generation of a Local Oscillator (LO) signal and makes use of a mixer which employs a LO as a frequency selector. The spectral purity of the LO can be an important consideration for effective RF signal reception.

A parameter typically used to quantify the spectral purity of a LO is the phase noise (expressed in dB/Hz), wherein a good LO signal will have a low phase noise.

In order to achieve a good phase noise, conventional systems use a low noise VCO (Voltage Controlled Oscillator), which enables frequency tuning.

However, modern telecommunication systems are required to deal with a very wide tuning range (for example, a range where the maximum frequency divided by the minimum frequency of the range is greater than two).

A conventional VCO cannot typically be tuned over such a wide range of frequencies without a reduction in the phase noise performance (i.e. without an increase in the phase noise). For this reason, it is known to place a programmable frequency divider between a VCO and a mixer in order to extend the tuning range. Such a frequency divider is often referred to as a LO chain and typically has two outputs (I and Q), balanced duty cycles, and low output noise. However, such features increase the design complexity of a frequency divider. The higher the complexity, the more difficult it is to achieve an acceptable trade-off between noise and power consumption.

A way to achieve very low phase noise with low power consumption is to 're-clock' the output of a frequency divider by a higher frequency, as shown in FIG. 1. Here, the first and second outputs of a LO chain 10 are provided to first 12 and second 14 data flip-flops, respectively. The input reference clocking signal $F_{IN}$ provided to the LO chain 12 is also provided to the clock input terminal of the first 12 and second 14 data flip-flops. Thus, it can be seen how the I and Q outputs of the LO chain 12 are clocked by the input reference clocking signal $F_{IN}$ (which is of a higher frequency than the I and Q outputs). Accordingly, this technique is known as "re-clocking" and enables the reduction of accumulated jitter in the LO chain frequency divider.

This known technique of re-clocking poses the problem of how to re-clock (i.e. "re-time" or align) the LO chain output signal with a low noise (or low jitter) high frequency reference clocking signal. Conventional approaches assume that the operating frequency (i.e. the frequency of the reference clocking signal) is low enough to enable ideal control of the phase of both the re-clocking signal (i.e. the reference clocking signal) and the frequency divider output signal. If this is not the case, then metastability in the re-clocking flip-flop(s) may occur, as illustrated in FIGS. 2A-2B.

As shown in FIG. 2A illustrated, if the flip-flop data input D outside of a brief time window during which the reference clocking signal $F_{IN}$ rises, the output Q of the flip-flop correctly takes on the value of data input D without any instability. However, as shown in FIG. 2B, if the flip-flop data input D changes at the same time the reference clocking signal $F_{IN}$ rises (or within a small time window surrounding the time at which the reference clocking signal $F_{IN}$ rises), the output Q may become undefined. This is because the delay between both signals is less than the minimum set-up/hold time of the flip-flop.

BRIEF SUMMARY OF THE INVENTION

According to an embodiment of the invention, there is provided a local oscillator signal generation circuit according to independent claim 1.

Compared to conventional approaches, embodiments may exhibit reduced power consumption whilst also achieving reduced phase noise.

According to an embodiment of the invention, there is provided a method of generating a local oscillator signal for a frequency divider circuit according to claim 9.

Embodiments may be used in broadband receiver applications, such as analog TV broadcasting, digital TV broadcasting, cable TV broadcasting, satellite broadcasting, UMTS, etc Embodiment may be applicable to any application where two edges need to be aligned for re-clocking purposes.

BRIEF DESCRIPTION OF THE DRAWINGS

Preferred embodiments of the present invention will now be described, by way of example only, with reference to the following drawings in which.

DETAILED DESCRIPTION OF THE EMBODIMENTS

Figure 1:
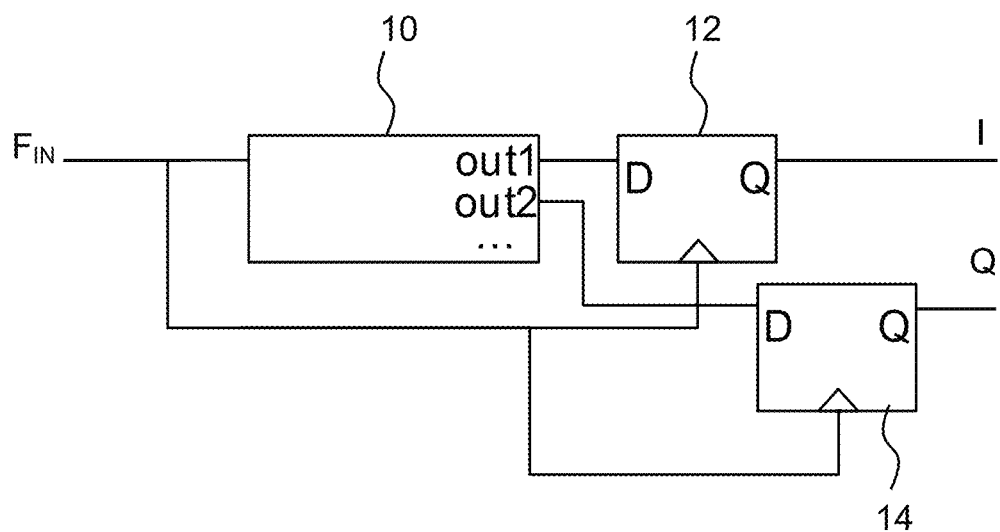
FIG. 1 illustrates a conventional re-clocking arrangement wherein the outputs of a LO chain are clocked by the input reference clocking signal of the LO chain.
Figure 2A:
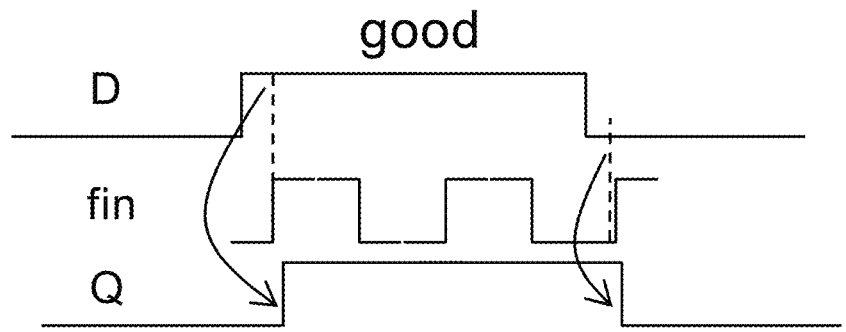
FIG. 2a is a timing diagram illustrating good alignment of the data input and the input reference clocking signal for a convention re-clocking arrangement like that of FIG. 1.
Figure 2B:
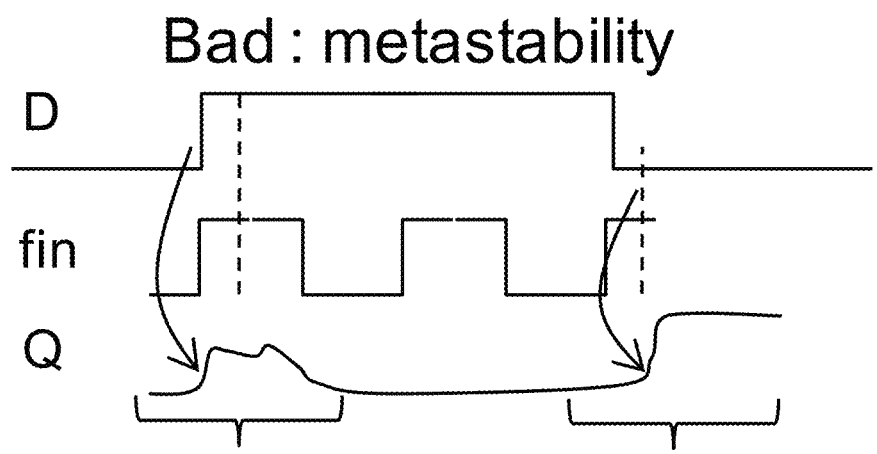
FIG. 2b is a timing diagram illustrating poor alignment of the data input and the input reference clocking signal for a convention re-clocking arrangement like that of FIG. 1.
Figure 3:
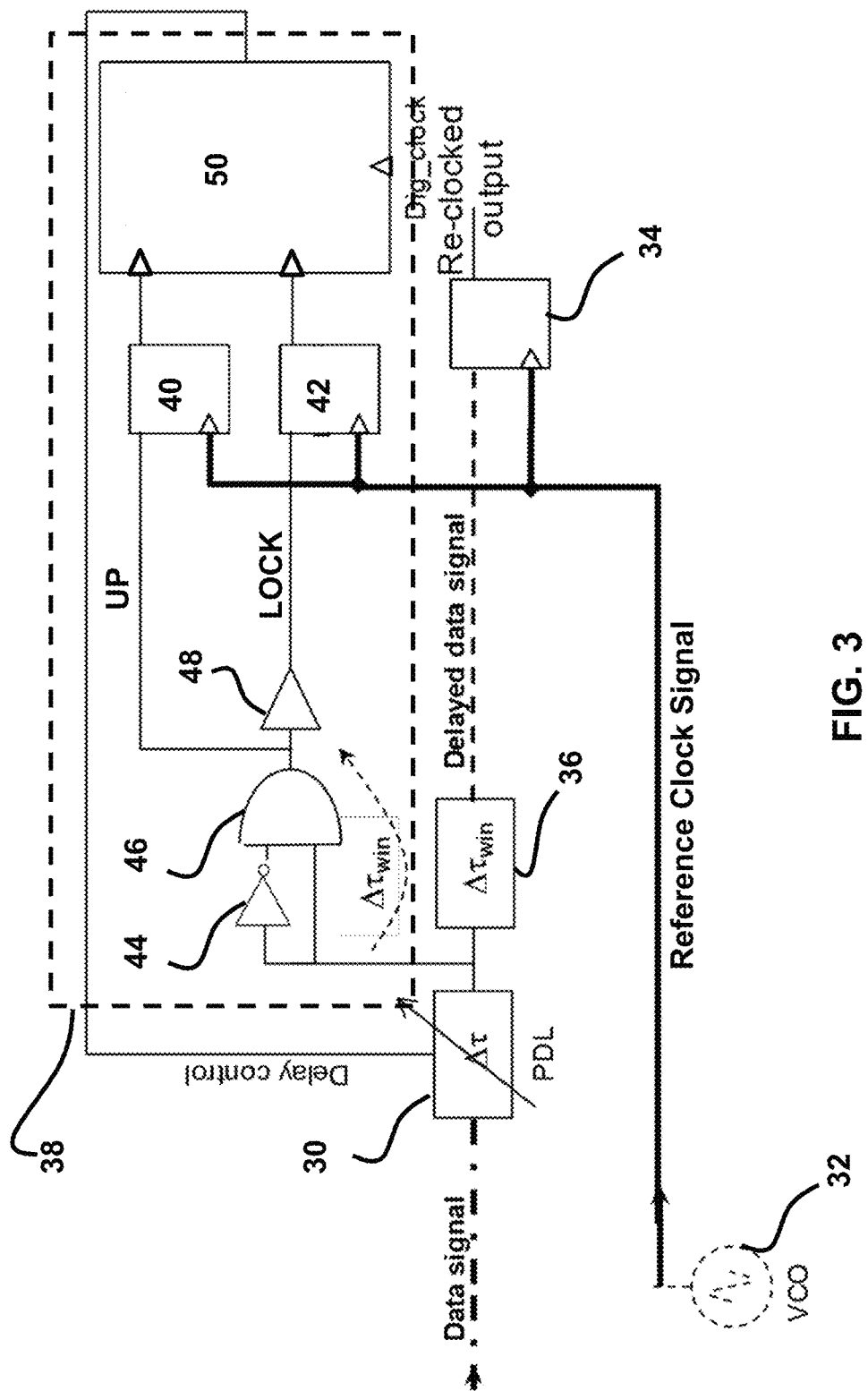
FIG. 3 is a schematic block diagram of a local oscillator signal generation circuit according to an embodiment.

Referring to FIG. 3, there is shown a schematic block diagram of a local oscillator signal generation circuit according to an embodiment of the invention. The circuit comprises a Programmable Delay Cell (PDL) 30 adapted to delay a data signal by variable time period ΔT according to a delay control signal. Depending on the delay control signal, the PDL is adapted to delay the data signal within at least two periods of a reference clock signal that is provided to the circuit.

Here, the reference clock signal is provided from a VCO 32 and the frequency of the reference clock signal is the signal of highest frequency within the circuit. The reference clock signal is provided to the clock input terminal of a data flip-flop 34, thus acting as the clock signal for the data flip-flop.

The delayed data signal provided by the PDL is passed through an additional fixed delay unit 36 (which further delays the delayed data signal by a fixed time period of ΔTwin) to the data input terminal of the data flip-flop 34.

The circuit further comprises a control arrangement 38 which is adapted to generate first (Up) and second (Lock) partially overlapping pulse windows from the delayed data signal and to generate the delay control signal based on the first (Up) and second (Lock) partially overlapping pulse windows and the reference clocking signal. In particular, the control arrangement 38 generates the delay control signal for the PDL 30 so as to control the amount by which the data signal is delayed by the PDL in order to control the phase relationship between the data signal and the reference clock signal (in other words, align the rising edges of the data signal and the reference clock signal so as to have a predetermined spacing/separation in time and ensure that the data signal is stable when it is sampled by the data flip-flop). Controlling the phase relationship between the data signal and the reference clock may thus ensure correct re-clocking of the data signal by data flip-flop 34.

In this embodiment, the control arrangement 38 comprises logic gates adapted to feed delayed versions of the delayed data signal (from the PDL) to first 40 and second 42 flip-flops. Here the logic gate arrangement comprises a first delay stage formed from an inverter 42 and an AND gate 46. The delayed data signal is provided to the first input of the AND gate 46 via the inverter 44, and also provided directly to the second input of the AND gate 46. This arrangement delays the delayed data signal by a fixed time period of ΔTwin. The output of the AND gate 46 is provided directly to the data input of the first flip-flop 40, and also provided to the data input of the second flip-flop 42 via a logic delay element 48. The logic delay element 48 introduces a time delay to the signal provided to the second flip-flop 42, thus acting as a second delay stage.

The flip-flops 40 and 42 are clocked by the reference clock signal so as to create first and second time windows called "UP" and "LOCK", respectively. These windows are overset from each other in the time domain so that they partially overlap each over.

The UP and LOCK windows are input to a state machine 50 which is adapted to output the delay control signal (as a voltage or a digital word) to control the delay introduced in the data signal by the PDL 30.

Thus, the control arrangement 38 is input with the delayed data signal and the reference control signal and, based on first and second partially overlapping pulse windows generated from the delayed data signal, the control arrangement outputs a delay control signal for controlling the PDL 30 so as to control the phase relationship between the data signal and the reference clock signal.

It will be appreciated that embodiments can be adapted to align the edges of two signals having different frequencies. Conventional Phase Frequency Detectors (PFDs) firstly aim to align the frequency of one signal (e.g. a feedback signal) to another signal (e.g. a reference signal). Once the two signals have the same frequency, the PFD can output a signal (generally a current) proportional to the phase difference between the signals. This current may be integrated in a filter used to tune a VCO, or variable delay cell, or any element whose phase or frequency can be tuned. However, this is not appropriate when it is desired not to alter the frequency of one signal to adjust it to the other one.

Figure 4:
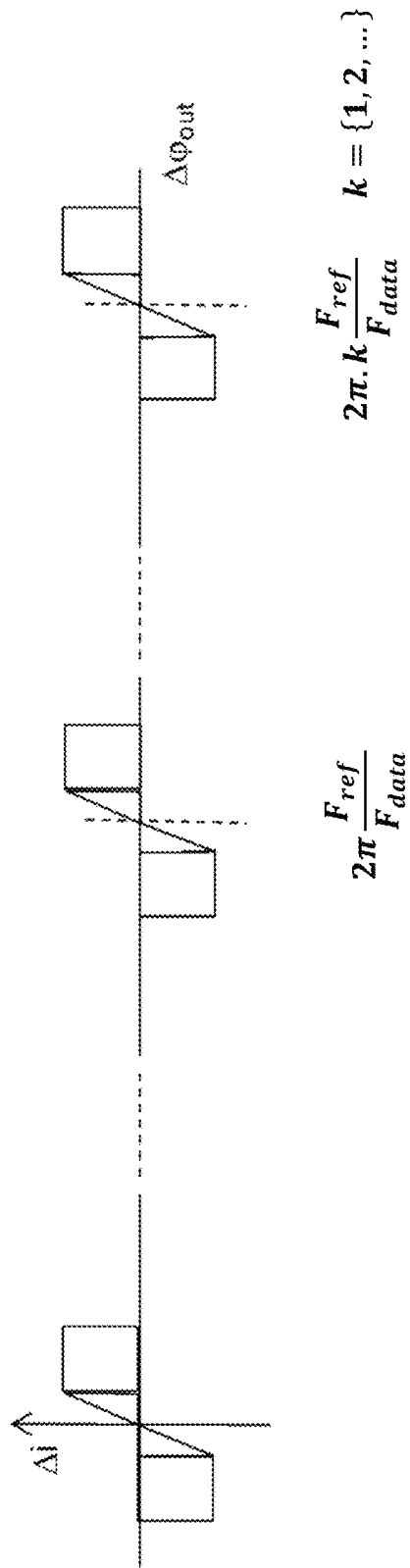
FIG. 4 illustrate the transfer function of the embodiment of FIG. 3.
Figure 5:
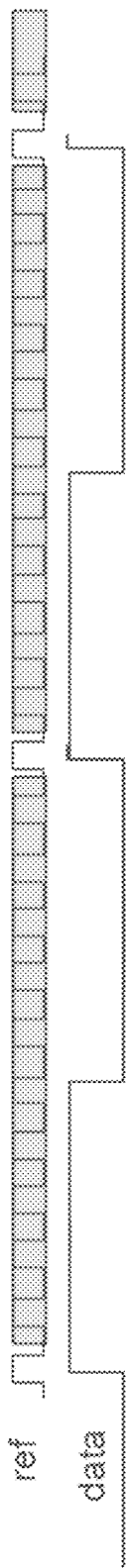
FIG. 5 illustrates how the transfer function shown in FIG. 4 can be seen as a mask on a reference clock signal in the time domain.

The transfer function of the control arrangement 38 of the embodiment of FIG. 3 is illustrated in FIG. 4. The transfer function has gain (i.e is able to provide a signed signal proportional to the phase difference between two signals) at every $2k\pi \cdot Fref/Fdata$ of the slowest signal, where Fref is the frequency of the reference clock signal and Fdata is the frequency of the data signal. As shown in FIG. 5, this transfer function can be seen as a mask on the reference clock signal in the time domain. The data signal edges will only be compared to the edges of the reference clock signal that are in within mask (shown by the greyed boxes).

Accordingly, the proposed control arrangement may be understood to be phase detector having as inputs the masked reference clock signal and the data signal. However, in order to actually see if one signal leads or lags the other one, it is proposed to implement a two wires mask, that is to say, two overlapping masks (named "UP" and "LOCK" in the embodiment of FIG. 3). The reference clock signal samples the two masks and the state machine implements decisions depending on the result of the two samplings.

Figure 6:
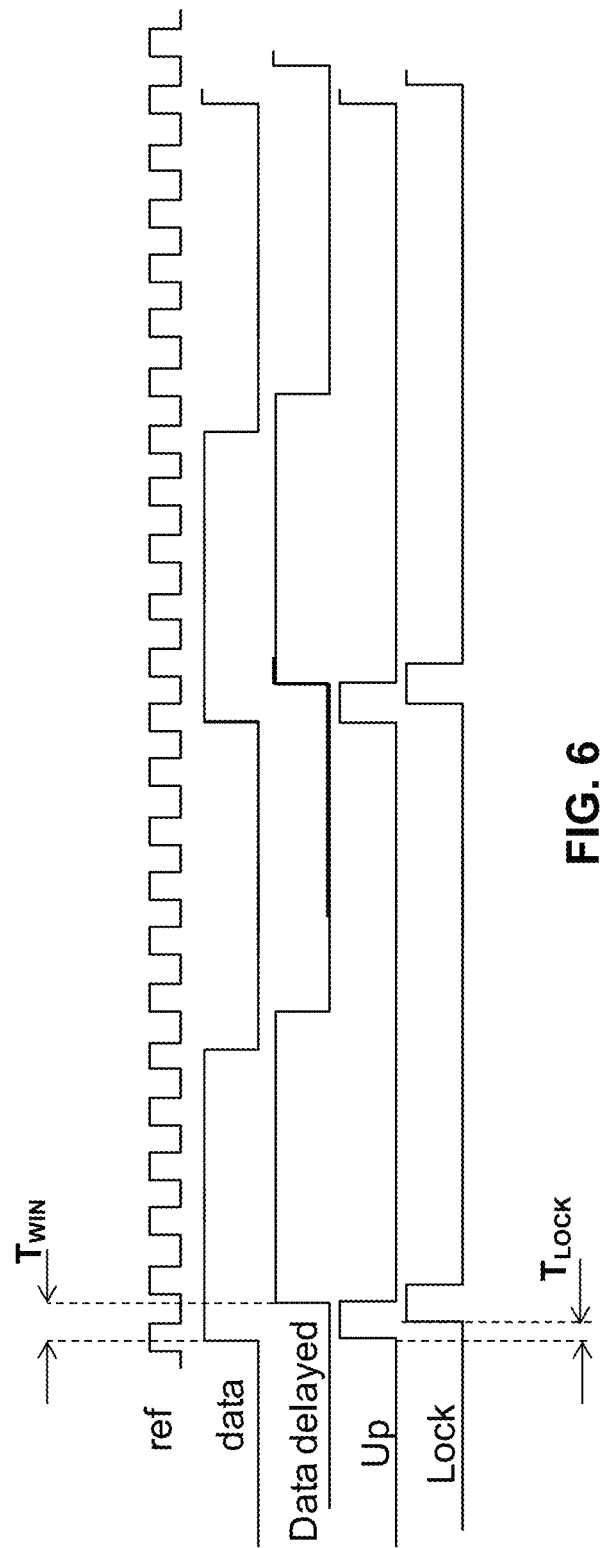
FIG. 6 shows the amplitude variations of various signals within the embodiment of FIG. 3.
Figure 7A:
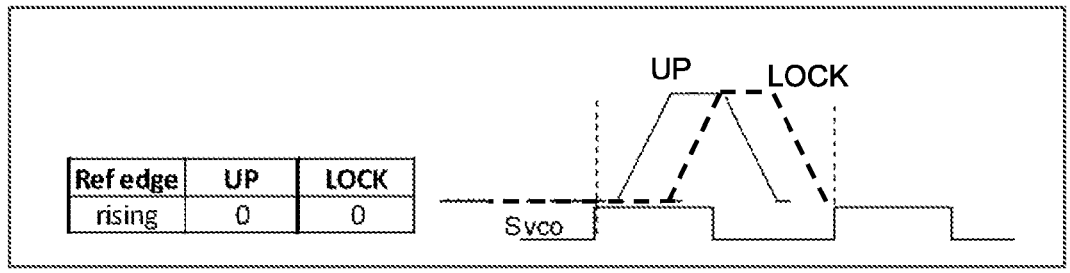
FIGS. 7A-7D show chronograms related to different values of UP and LOCK as illustrated in Table 2.
Figure 7B:
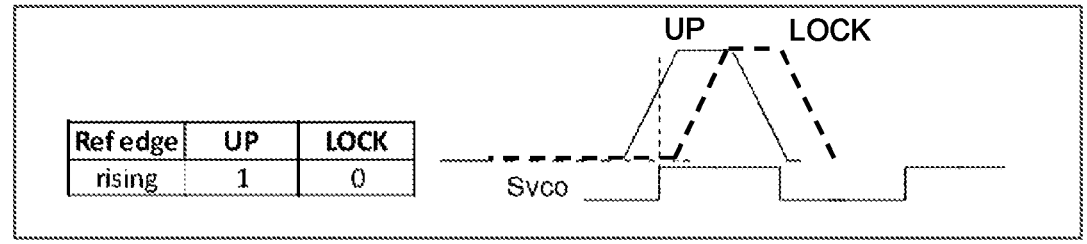
Figure 7C:
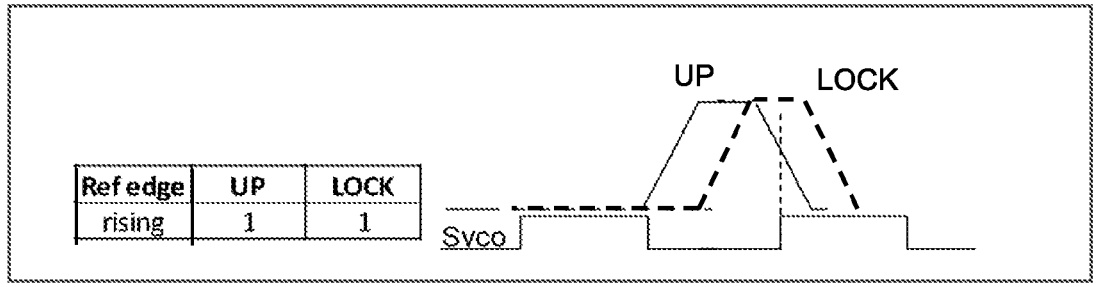
Figure 7D:
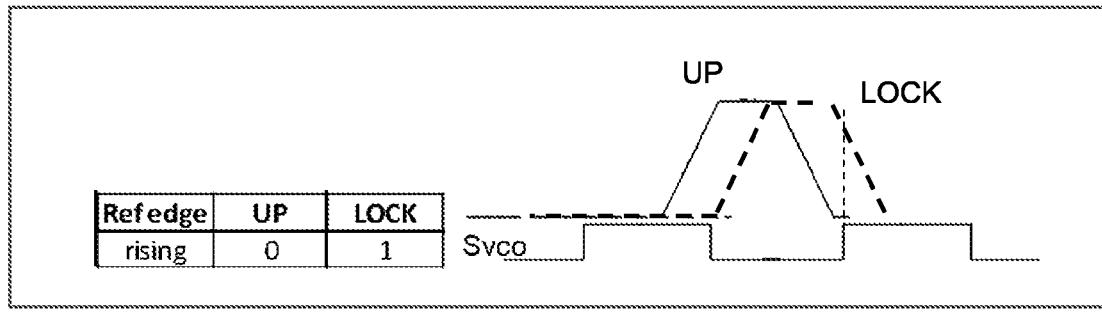

By way of illustration, such a masking operation (which may also be referred to as "windowing") may be performed as shown in FIG. 6. FIG. 6 shows the amplitude variations of various signals within the embodiment of FIG. 3.

The data signal ("data") is delayed by a time $T_{WIN}$ to provide a delayed data signal ("Data_delayed"). The AND operation between the data signal ("data") and it delayed version ("Data_delayed") provides the first mask signal ("UP"), and further delaying of this first mask signal ("UP") by a time $T_{LOCK}$ provides the second mask signal ("LOCK"). From the description of FIG. 3, it will be understood that the first ("UP") and second ("LOCK") mask signals are provided at the data inputs of the first 40 and second 42 flip-flops. The response of each of the first 40 and second 42 flip-flops is illustrated in Table 1 below:

TABLE 1

| DATA input | clock input | |
|---|---|---|
| 0 | Rising edge | 0 |
| 1 | Rising edge | 1 |
| X | X | Former state |

Depending on the position of the reference clock signal rising edges in these pulse windows, decisions are made by the state machine 44 to increase or decrease the a delay provided by the PDL 30.

By way of example, if the delay value provided by the PDL can be varied in the range of [−1.5×Tref; 1.5×Tref] (where Tref is the period of the clock reference signal) for a delay control word Dw<7:0> having a value in the range of [0; 255], the data signal will not be delayed by the PDL 30 if Dw=127 (i.e. has a value in the middle of its possible range). The delay can be increased or decreased by a small value "m" or a bigger value "k". The value of m and k may be identical, but having bigger a value for k may minimize a locking time. Thus, in an embodiment, a higher value of k may provide a smaller the locking time, and a smaller value of m may enable improved delay adjustment accuracy.

It will be understood that the delay control word Dw need not be eight (8) bits, but instead may be represented using more or less bits depending on the parameters such as frequency, accuracy, affordable ripple on the data path, etc.

When the first ("UP") and second ("LOCK") mask signals and a rising edge of the reference signal occur, the output of the first 40 and second 42 flip-flops rises, and will last one period of the reference clock signal. The mask signals "UP" and "LOCK" are less than one period of the reference signal, meaning that if one edge of the clock reference signal falls within a mask signal pulse, then the following rising edge of the clock reference signal will fall out of the same mask signal pulse, thus making the flip-flop output become zero ("0").

The state machine 50 implements two parallel edge-sensitive processes, clocked by the output of the first 40 and second 42 flip-flops. Each time a rising edge occurs, it updates an UP or LOCK register, that will be taken into account and synchronized with regards to the state machine clock. The delay control word, Dw, is directly controlled by the state machine 50. Table 2 below illustrates the different situations and corresponding action by the state machine 50:

TABLE 2

| | Ref Edge | UP | LOCK | Dw <7:0> | Action |
|---|---|---|---|---|---|
| | Rising | 0 | 0 | >127 @ ramping start | Dw = Dw − k |
| | Rising | 0 | 0 | <128 @ ramping start | Dw = Dw + k |
| | Rising | 0 | 0 | <255 − fast_step | Dw = Dw + k |
| | Rising | 0 | 0 | <255 | Dw = Dw + m |
| | Rising | 0 | 0 | >0 | Dw = Dw − m |
| | Falling | x | x | | No Change |
| Issue with the delay range | Rising | 1 | 0 | >=255 − fast_step | Dw = 127 |
| | Rising | 1 | 1 | 255 | Dw = 127 |
| | Rising | 0 | 1 | 0 | Dw = 127 |

Various situations of Table 2 above are illustrated by the chronograms of FIGS. 7A-7D that show the UP pulse window, the LOCK pulse window and the reference clock signal (referred to FIGS. 7A-7D as "Svco").

Experimental implementations have shown that the arrangement tends to position the reference clock signal rising edges in the LOCK window, and at the right end side of the UP window. In this situation, the arrangement is said to be "Locked" with the reference clock signal rising edge always falling in the LOCK window and gently going in and out of the UP window. Thus, in a locked situation, it is observed that Dw fluctuates around a middle value (e.g 127), accounting for the fact the arrangement is stable when going in and out of the UP window while keeping the reference edge in the LOCK window.

Figure 8:
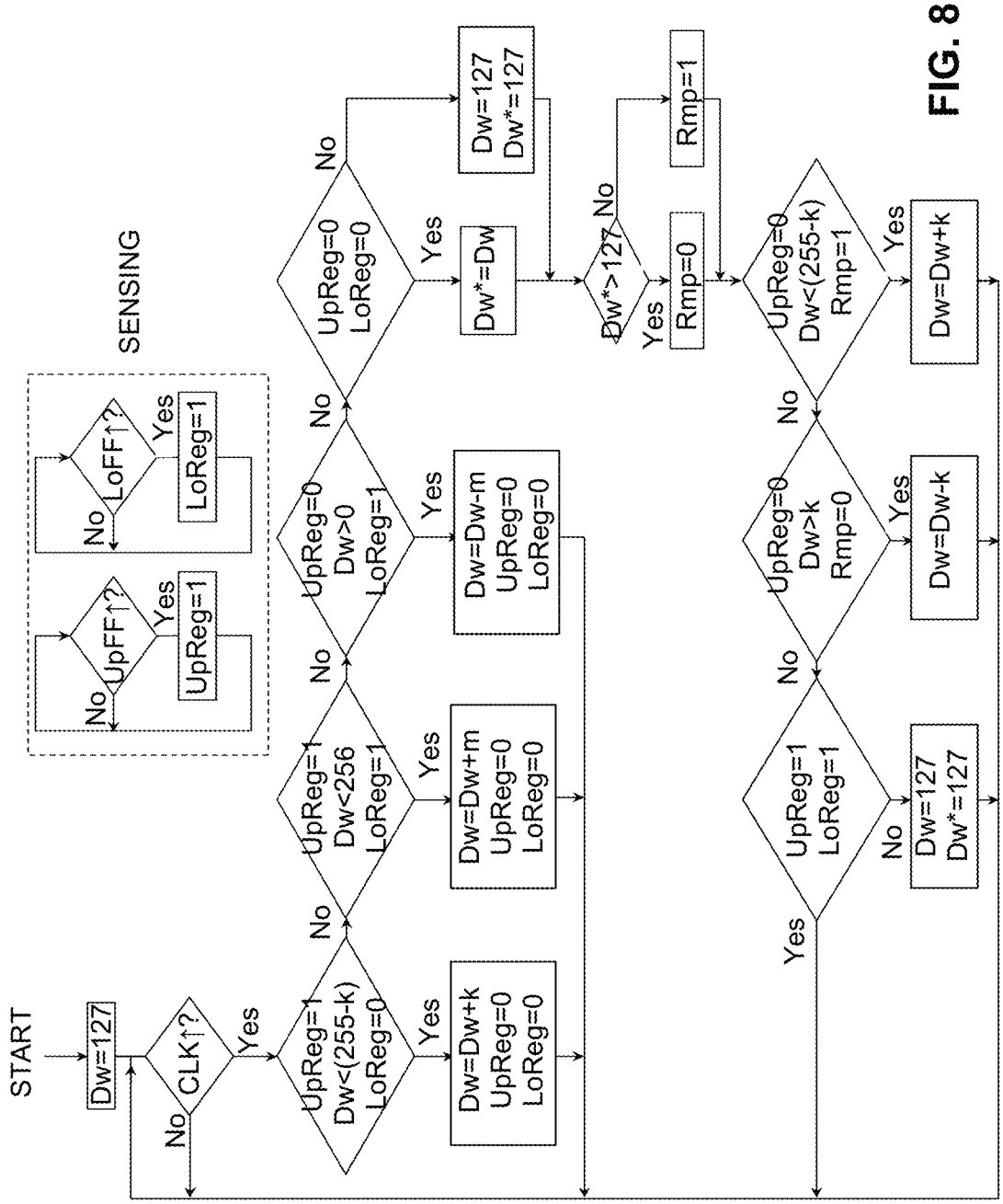
FIG. 8 shoes an exemplary decision flowchart of an algorithm employed by a state machine according to an embodiment.

An exemplary decision flowchart of an algorithm employed by a state machine according to an embodiment is shown in FIG. 8.

Here:

UpReg=Boolean register set to 1 when a rising edge at the first flip-flop 40 (UpFF) output has occurred. It is reset at each iteration.

LoReg=Boolean register set to 1 when a rising edge at the second flip-flop 42 (LoFF) output has occurred. It is reset after each iteration.

Rmp=Boolean register set to 1 when the algorithm makes an attempt to have the reference rising edge in either the UP or LOCK window by increasing Dw. When 0, the algorithm decreases Dw.

The algorithm starts by setting the delay control word Dw to a middle value (which is 127 for this example where Dw is an 8-bit word having a value in the range of 0-255). The algorithm loops until a rising edge of the clock reference signal CLK is detected at the state machine clock input terminal. On a rising edge of the clock reference signal CLK is detected, the values of UpReg, Dw, and LoReg are checked. If at least one of UpReg and LoReg is set to 1, the algorithm adjust the value of Dw depending on the values of UpReg, Dw, and LoReg and then returns to check for another rising edge of the clock reference signal CLK.

If both UpReg and LoReg are set to 0, a secondary delay control word Dw* is set to equal the value of the delay control word Dw. Otherwise, a 'reset at middle' is performed such that both the secondary delay control word Dw* and the delay control word Dw are set to a middle value value (which is 127 for this example where Dw is an 8-bit word having a value in the range of 0-255). The value secondary delay control word Dw* is then checked to see if it is greater than the middle value (127 in this example). If it is greater than the middle value, the ramp sign Rmp is set to zero "0" to indicate that the delay control word needs to be decreased. If the value secondary delay control word Dw* is not greater than the middle value, the ramp sign Rmp is set to one "1" to indicate that the delay control word needs to be increased. Next the values of the values of UpReg, Dw, Dw*, Rmp and LoReg are checked and, depending on their values, the value of the delay word value Dw is set accordingly, before the algorithm returns to check for another rising edge of the clock reference signal CLK.

Figure 9:
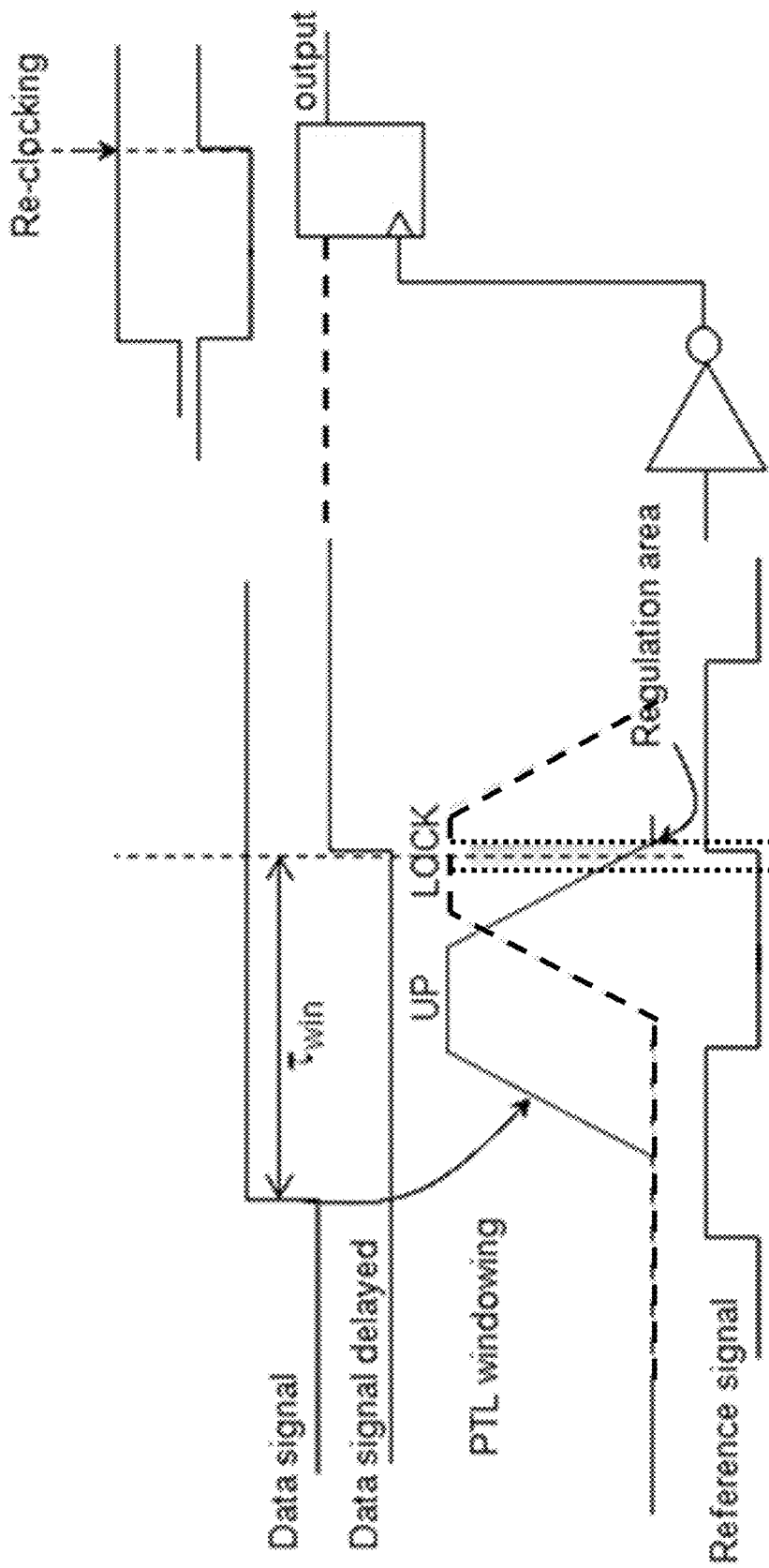
FIG. 9 illustrates the creation of a delayed data signal that can be used as the data input of the re-clocking flip-flop according to an embodiment of the invention.

The delay between the data signal and the precise signals alignment time is Twin. FIG. 9 illustrates the creation of a data signal delayed within Twin that can be used as the data input of the re-clocking flip-flop 34.

The set-up time of the re-clocking flip-flop 34 is chosen to be small enough to ensure that half a period of the reference signal is long enough to make sure that there is no noise coming from the data path (which could be the case if the data provided to the last latch was not stabilized).

Figure 10:
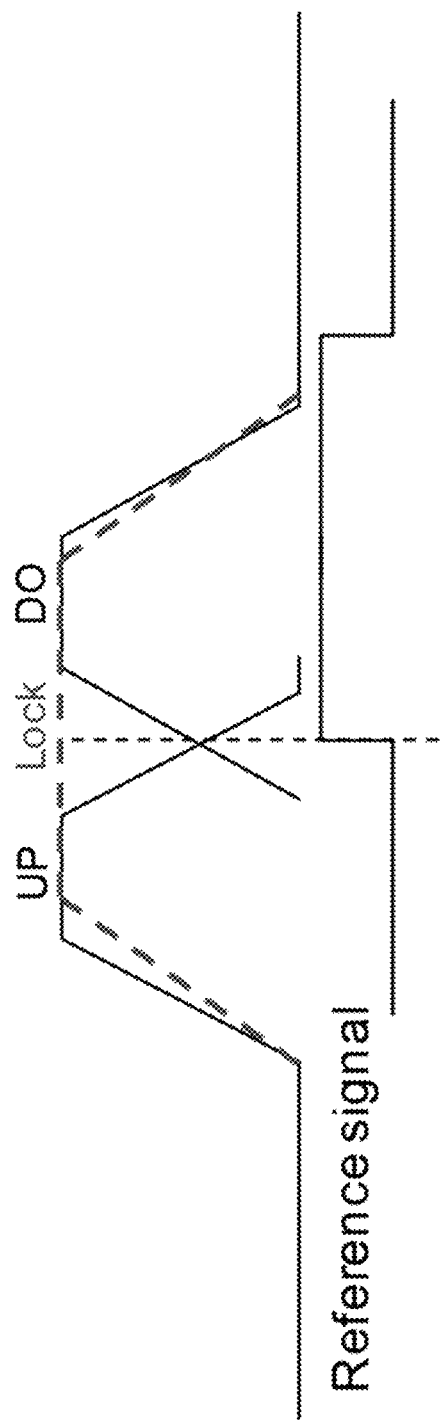
FIG. 10 illustrates the use of three masking windows (UP, DO, and LOCK) according to an alternative embodiment of the invention.

Although the embodiment described above in reference to FIG. 3 has been detailed as implementing two masks so as to fit the data signal with the period of the reference signal, alternative embodiments may employ more masks. For example, FIG. 10 illustrates the use of three masking windows (UP, DO, and LOCK) according to an alternative embodiment of the invention. In this case, the lock condition is obtained when the reference signal rising edge is in the LOCK window and when it is out of the UP and DO windows. An advantage associated with this embodiment is that in lock state, the control word Dw does not change, meaning there is less activity on the data line.

Figure 11:
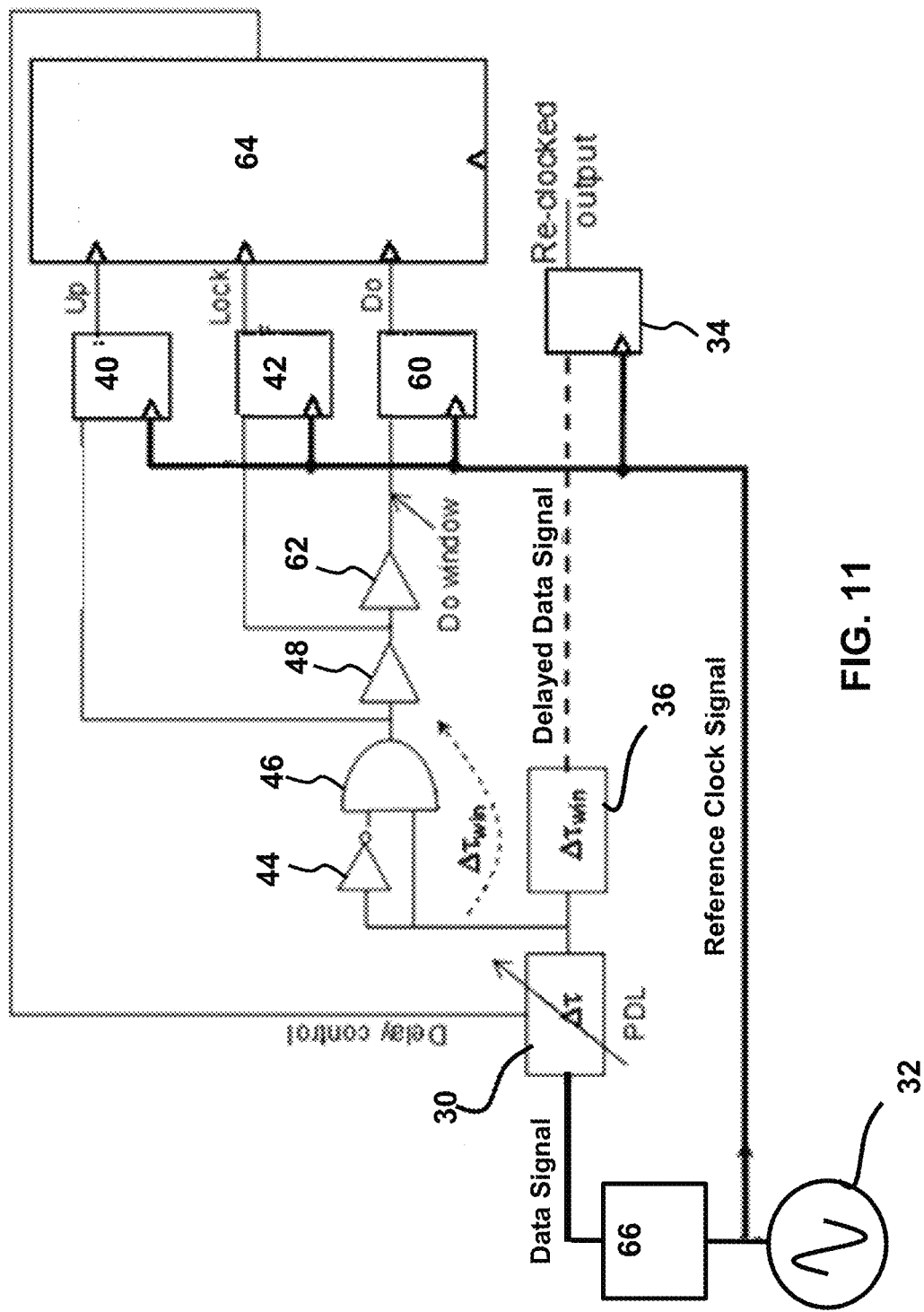
FIG. 11 is a schematic block diagram of a local oscillator signal generation circuit according to another embodiment of the invention.

Such an embodiment employing three masking windows may be implemented as shown in FIG. 11. Compared to the embodiment of FIG. 3, this alternative embodiment employs a third (additional) flip-flop 60, an additional logic delay element 62, and a modified state machine 64 to accommodate the three window inputs.

It is also noted that, in the embodiment of FIG. 11, the data signal is derived from the VCO 32. More specifically, the VCO 32 output is fed to the PDL 30 via a RF divider 66. Put another way, the data signal is derived from the reference clocking signal by passing the reference clocking signal through a frequency divider and using the output of the frequency divider 66 as the data signal. Thus, the signal to re-clock (or to retime) is linked to the signal used for the reference clock signal.

Embodiments may be captured in a computer program product for execution on a processor of a computer, e.g. a personal computer or a network server, where the computer program product, if executed on the computer, causes the computer to implement the steps of a method according to an embodiment. Since implementation of these steps into a computer program product requires routine skill only for a skilled person, such an implementation will not be discussed in further detail for reasons of brevity only. In an embodiment, the computer program product is stored on a computer-readable medium. Any suitable computer-readable medium, e.g. a CD-ROM, DVD, USB stick, memory card, network-area storage device, internet-accessible data repository, and so on, may be considered.

Other variations to the disclosed embodiments can be understood and effected by those skilled in the art in practising the claimed invention, from a study of the drawings, the disclosure, and the appended claims.

In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A local oscillator signal generation circuit for a frequency divider circuit comprising:
a delay device adapted to delay a data signal according to a control signal;
a data flip-flop having the delayed data signal provided to its data input terminal and a reference clocking signal provided to its clock input terminal; and
a control circuit adapted to generate first and second partially overlapping pulse windows from the delayed data signal and to generate the control signal based on the first and second partially overlapping pulse windows and the reference clocking signal,
wherein the control signal is provided to the delay device to control the amount by which the data signal is delayed so that the data signal is stable when it is sampled by the data flip-flop, and wherein a local oscillator signal is derived from the output of the data flip-flop.

2. The circuit of claim 1, wherein the control circuit is further adapted to generate a third pulse window which at least partially overlaps the first and second pulse windows, and to generate the control signal further based on the third pulse window.

3. The circuit of claim 1, wherein the control circuit comprises:
a logic arrangement adapted to generate first and second differently delayed versions of the delayed data signal;
a first flip-flop having the first delayed version of the data signal provided to its data input terminal and the reference clocking signal provided to its clock input terminal;
a second flip-flop having the second delayed version of the data signal provided to its data input terminal and the reference clocking signal provided to its clock input terminal; and
a state machine adapted to receive an output signal from each of the first and second flip flops and to generate the control signal based on the received signals from the first and second flip flops.

4. The circuit of claim 3, wherein the logic arrangement is further adapted to generate a third differently delayed version of the delayed data signal,
wherein the control circuit further comprises a third flip-flop having the third delayed version of the data signal provided to its data input terminal and the reference clocking signal provided to its clock input terminal;
and wherein the state machine is adapted to receive an output signal from the third flip flop and to generate the control signal further based on the received signal from the third flip flop.

5. The circuit of claim 1, wherein the delayed data signal is provided to the data input terminal of the data flip-flop via an additional delay device that further delays the delayed data signal.

6. The circuit of claim 1, further comprising a voltage controlled oscillator adapted to generate the reference clocking signal.

7. The circuit of claim 1, further comprising a frequency divider adapted to derive the data signal from the reference clocking signal.

8. A frequency divider circuit comprising a local oscillator signal generation circuit according to claim 1.

9. A method of generating a local oscillator signal for a frequency divider circuit, the method comprising the steps of:
providing a data signal to a delay circuit adapted to delay the data signal;
providing the delayed data signal to a data input of a data flip-flop;
providing a reference clocking signal to a clock input of the data flip-flop;
generating first and second partially overlapping pulse windows from the delayed data signal; and
based on the first and second partially overlapping pulse windows and the reference clocking signal, controlling the amount by which the data signal is delayed so that the data signal is stable when it is sampled by the data flip-flop.

10. The method of claim 9, further comprising the step of generating a third pulse window which at least partially overlaps the first and second pulse windows, and wherein the step of controlling is further based on the third pulse window.

11. The method of claim 9, wherein the step of generating first and second partially overlapping pulse windows comprises:

generating first and second differently delayed versions of the delayed data signal;

providing the first delayed version of the data signal to the data input terminal of a first flip-flop having its clock input terminal connected to the reference clocking signal;

providing the second delayed version of the data signal to the data input terminal of a second flip-flop having its clock input terminal connected to the reference clocking signal; and deriving the first and second partially overlapping pulse windows from the output signals of the first and second flip flops, respectively.

12. The method of claim 9, further comprising the step of generating the reference clocking signal with a voltage controlled oscillator.

13. The method of claim 9, further comprising the step of deriving the data signal from the reference clocking signal by passing the reference clocking signal through a frequency divider and using the output of the frequency divider as the data signal.

14. A method of frequency dividing a radio frequency signal comprising the step of generating a local oscillator according to the method of claim 9.

15. A computer program product for generating a local oscillator signal, the computer program product comprising a computer-readable storage medium having computer-readable program code embodied therewith, the computer-readable program code configured to perform all of the steps of claim 9.

* * * * *